United States Patent [19]

Wegmann et al.

[11] Patent Number: 5,039,913
[45] Date of Patent: Aug. 13, 1991

[54] METHOD FOR THE COOLING OF TARGETS AS WELL AS COOLING DEVICE FOR TARGETS

[75] Inventors: Urs Wegmann, Oberschan; Walter Haag, Grabs, both of Switzerland

[73] Assignee: Balzers Aktiengtesellschaft, Balzers, Liechtenstein

[21] Appl. No.: 532,383

[22] Filed: Jun. 4, 1990

[30] Foreign Application Priority Data

Jun. 5, 1989 [CH] Switzerland .................. 2107/89

[51] Int. Cl.$^5$ .................................................. H01J 7/24
[52] U.S. Cl. ................................. 315/112; 313/22; 313/35
[58] Field of Search .................. 315/112; 313/11, 22, 313/35

[56] References Cited

U.S. PATENT DOCUMENTS 4,891,560 1/1990 Okumura et al. ............... 315/111.41
4,911,814 3/1990 Matsuoka et al. ........... 350/423 R X Primary Examiner—Eugene R. LaRoche
Assistant Examiner—Do Hyun Yoo
Attorney, Agent, or Firm—Notaro & Michalos

[57] ABSTRACT

The rear surface of an sputtering target (1) is actively cooled exclusively in regions spaced from breakthrough-prone regions. The cooling takes place in regions along the erosion profile outside of the regions of greatest erosion rate. For this purpose a cooling device for the target (1) has channels (7) through which a coolant flows. These channels (7) extend outside the regions (4) of strongest erosion of the target (1). The cooling channels (7) have on the side facing the back surface of the target, one foil-like closure wall (10). The cooling channels (7) extend in a cooling plate (6) and are separated from each other by webs (8). The webs (8) extend in the region of strongest erosion (4) of the target (1) in order to mechanically support these regions (4). Therewith it is possible to utilize expensive target material to the limit of its removal, without however risking a breakthrough of the target due to the erosion in an area where coolant will leak.

21 Claims, 1 Drawing Sheet

METHOD FOR THE COOLING OF TARGETS AS WELL AS COOLING DEVICE FOR TARGETS

FIELD AND BACKGROUND OF THE INVENTION

The present invention relates to a method for the cooling of targets in sputtering sources as well as a cooling device for targets of sputtering sources with a target and with through which flow cooling agents.

When sputtering targets with sputtering sources, in particular when using so-called high rate sources such as magnetron sputtering sources, the problem is encountered of recognizing in time when the target has been consumed. If the plasma process is not interrupted in time, the target erodes through whereby an opening is created which exposes the rearward constructional elements of the magnetron source facing the plasma. This leads to a joint erosion of construction material which means as a rule an unacceptable contamination of the high purity layer to be generated. A breakthrough would have even more serious consequences for the cooling device whereby cooling medium penetrates into the process chamber. This leads to a destruction of the substrates as well as to complete failure of the installation and concomitant high expenses.

It is known that in the case of cathode sputtering installations the so-called targets must be cooled to achieve optimum operating capacity during sputtering of the targets. This cooling can be direct or indirect in that with the former the target can be brought into direct contact with the coolant liquid, e.g. water, or in the case of the latter, indirectly via an intermediate wall. The heat to be carried off can consequently either be carried off through heat transmission directly to the cooling medium in the case of direct cooling or through heat conduction through a wall in the case of indirect cooling.

It is further known, that with direct cooling the target mounting must be constructed especially carefully due to the danger of leaks.

With indirect cooling the cooling medium flows through cooling channels disposed in the interior of a back plate. This cooling method is without problems in terms of leakage, however it is significantly less effective with respect to cooling effect than direct cooling.

To circumvent the disadvantages of direct cooling and those of indirect cooling as well, it has also become known to implement the back plate, as in the case of direct cooling, with channels that are open toward the rear surface of the target and to close off these channels by a flexible foil, preferably comprising a metal, toward the outside in a liquid-tight manner. In operation the liquid pressure in the cooling channels causes the flexible metal foil to be pressed against the rear surface of the target and in this manner, heat transmission is significantly improved through the increase of heat conduction. See: J. Vac. Sci. Technol. A2(3), July-Sept. 1984 "Cathode cooling apparatus for a planar magnetron sputtering system" by M. R. Lake and G. L. Harding as well as "Planar Magnetron Zerstaubungsquellen" by Dipl.-Ing. Urs Wegmann, Balzers Fachbericht, BB 800 014 DD 8102.

In the Balzers report it is shown what the so-called removal profiles of targets generated by erosion look like. In the center of the erosion zone of the target a V-form depression originates. The target material, in other words, is not eroded uniformly. For the purpose of utilization of the expensive target materials however, one goes to the limit without risking a breakthrough of the target due to the erosion against the back plate.

SUMMARY OF THE INVENTION

The present invention has as its purpose the creation of a method for the optimum economical utilization of targets and reduction of the risk of having to prepare for serious breakthroughs of the target toward the cooling medium through erosion, in particular with disturbances of operation.

Accordingly, an objection of the present invention is to provide a method for cooling targets which act as sputtering sources, wherein the rear surface of the target is cooled exclusively in areas where breakthrough is least likely, following an erosion profile in the target.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF THE PREFERRED EMBODIMENTS

Figure 1:
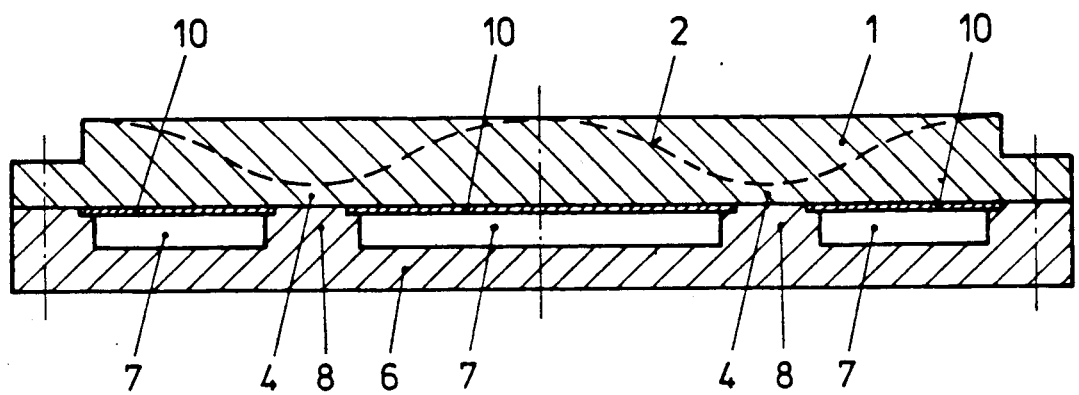
FIG. 1 is a cross section through a target with a drawn-in removal or erosion profile and disposed below a back plate with cooling channels which are closed off by a flexible diaphragm.

FIG. 1 is the cross section of a target 1, in which an erosion profile 2 is drawn which results during operation in the final phase of utilization of the target. In the region of the largest material removal, so-called breakthrough zones 4 result, in the front surface of the target where the danger of water intrusion exists, if for example a disturbance causes the target to be completely sputtered through.

Below the target 1 is a cooling plate 6 with cooling means channels 7 which are located outside of the region of the breakthrough zones 4. These regions are supported and sealed off by solid material webs 8 of the cooling plate 6 in such a way that with a potential breakthrough of the target 1 in the region of the breakthrough zones no immediate contact with the cooling water takes place. In this implementation the cooling means channels 7 are provided with channel closure diaphragms 10 toward the back surface of the target 1, which, since they are located outside the possible breakthrough zones 4 are not exposed to any direct sputtering. Therewith a breakthrough into the cooling means can be prevented. The cooling channels are implemented corresponding to the erosion profiles of the target 1, for example, angularly. It is also possible to place into the cooling means channels 7 metal tubes with flexible walls or pipes for conducting the cooling medium.

Applying the cooling means channels 7 outside the breakthrough zones 4 consequently decreases the risk, in particular in the event of disturbances which bring about a breakthrough into the cooling medium, wherein the potentially slightly lesser cooling effect due to this arrangement is practically not apparent. The cooling process can be controlled by means of the cooling means, thus can also be instationary.

The solid material webs 8 prevent an excessive deflection of a channel closure diaphragm since their free span due to the intermediate web decreases correspondingly. Furthermore, these webs 8 reinforce the cooling plate 6 wherein they additionally represent a protection of the easily damaged thin channel closure diaphragm 10.

Figure 2:
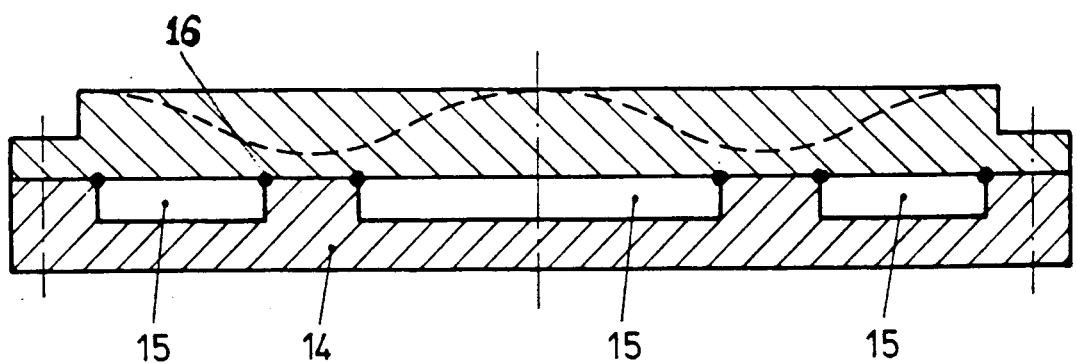
FIG. 2 is a representation which is similar to FIG. 1 but with direct cooling.

In FIG. 2 a direct cooling of the target is provided wherein one cooling plate 14 is provided with open cooling means channels 15. For sealing purposes, as is apparent, sealing cords 16 or the like are used between the target and the plate 14. Here too these channels are disposed outside the breakthrough zones at least to decrease, in the event of disturbance, the danger of a water intrusion.

When sputtering the target down to the solid part of the construction on the target back surface, the possibility still remains that the substrate becomes contaminated through the construction material. While this contamination bears no resemblance to that which would have been generated upon a cooling means intrusion, it is nevertheless desirable to exclude even the slightest possibility for contamination. A solution to this problem is achieved by the use of construction material which is tolerant to the process in the region of the target breakthrough to be expected as well as through timely switching-off of the process.

Construction material tolerant to the process is a material which does not impair, to an unacceptable degree, the layer quality in the event of contamination. Consequently this is a question of the careful selection of material for the region of the construction exposed in the event of target breakthrough. In many cases a coating of this exposed region is sufficient whereby greater degrees of freedom are made possible in the selection of the material for the mechanical construction as well as cost-effective solutions.

In the semiconductor industry for the coating of silicon wafers for example frequently metal alloys of aluminum with a few percentages of silicon and copper are used. The target to be used then comprises this alloy having a high degree of purity. A good choice for the construction material in the anticipated target breakthrough region is, in this case, copper having a high degree of purity. This material allows a favorable signal evaluation without influencing the process negatively since copper is a functional component of the layer. For signal evaluation, optical and/or electrical parameters can be used. As optical parameter the color of the plasma discharge can be monitored. In the stated example the plasma above the target of the above stated alloy with dominant aluminum fraction, when no target breakthrough is as yet present, has a blue color. If now a breakthrough occurs, some copper of the construction is exposed and activated through the plasma. The consequence is that the color of the plasma discharge changes from blue to green. This color change can be detected readily with known methods of optoelectronics. The resulting signal can be used to trigger further activities, as for example to switch off the process to be able to carry out a target change. A further possibility of signal detection consists in evaluating the electrical discharge conditions which change upon breakthrough. This can take place through simple measurements of changes in the current-voltage characteristic of the process. This is possible because the discharge voltage is a function of the material. A magnetron discharge with a target of the previously stated alloy at an operating power of 10 kW operates for example with a discharge voltage of 550 volts. Upon a target breakthrough the copper influences the plasma discharge and will lower the discharge voltage to approximately 500 volts. This process can be readily detected and, as already discussed in the case of the optical process, can be evaluated.

Within the scope of the present implementation therefore, for example, the entire width of the two solid material webs 8 can amount to one fifth of the total width of the target 1. However, it is possible to fall below this value but it should not be less than approximately 10%. These limit values correspond to the uncooled areas of the target in the region of the strongest erosion.

The described construction decreases the danger of water intrusion into the vacuum during sputtering of a target in the event of a disturbance. Possible cooling means intrusions upon eroding through of the target are avoided and thereby the operating safety of the device with simultaneous increase of the capacity is drastically improved.

The present invention consequently solves the problem of an unacceptable cooling means intrusion and increases the reliability of the operating behavior significantly.

All individual parts and individual features as well as their permutations, combinations and variations described in the specification and/or represented in the Figs. are inventive and specifically for n individual parts and individual features with the values n=1 to n—> infinity.

While specific embodiments of the invention have been shown and described in detail to illustrate the application of the principles of the invention, it will be understood that the invention may be embodied otherwise without departing from such principles.

What is claimed is:

1. A method of cooling an sputtering source target having a rear surface to be cooled, and a front surface with regions of low erosion where a breakthrough is less likely than regions of high erosion where a breakthrough is more likely, comprising actively and exclusively cooling the rear surface of the target in the regions of low erosion only.

2. A method according to claim 1, including cooling the rear surface of the target using cooling means and positioning the cooling means only in the regions of low erosion and at locations spaced away from the regions of high erosion whereby a breakthrough of the target does not take place at the cooling means.

3. A method according to claim 2, wherein the cooling means include means defining at least one channel for the flow of coolant, said channel being positioned in the regions of low erosion and spaced from the regions of high erosion.

4. A method according to claim 3, including rigid material webs at the regions of high erosion for supporting the target.

5. A method according to claim 4, wherein the at least one channel is bounded by the rigid material webs.

6. A method according to claim 1, including supporting the rear surface of the target by a rigid material web positioned at at least one of the regions of high erosion and at a location spaced away from the active cooling of the rear surface.

7. A method according to claim 1, including cooling the rear surface by utilizing cooling means defining at least one channel positioned adjacent the rear surface of the target in the regions of low erosion.

8. A method according to claim 7, including passing a coolant through the channel for cooling the target, the channel being open to the rear surface of the target.

9. A method according to claim 7, including passing a coolant through the channel for cooling the target, the channel being covered at the rear surface of the target by a flexible wall which is in contact with the rear surface of the target.

10. A method according to claim 6, wherein sputtering takes place under selected process conditions, the method including coating the web with material which changes the selected conditions when breakthrough at the regions of high erosion takes place to signal the occurrence of breakthrough.

11. A method according to claim 10, wherein sputtering takes place by the presence of a plasma at the front surface of the target, the process conditions comprising a color of the plasma, the color of the plasma changing when breakthrough takes place.

12. A method according to claim 10, wherein the process conditions include electrical signals, the electrical signals changing when breakthrough takes place.

13. A method according to claim 10 including making the rigid material web at least partly of copper in an area of the web immediately adjacent the rear surface of the target.

14. A device for cooling an sputtering source target having a rear surface to be cooled and a front surface with regions of low erosion where a breakthrough is less likely than regions of high erosion where a breakthrough is more likely, the device comprising a target support for supporting the target and being positioned adjacent the rear surface of the target, a plurality of channels defined in the target support for receiving a flow of coolant, said channels being positioned near the regions of low erosion and at locations spaced away from the regions of high erosion whereby the target is actively cooled in the regions of low erosion only.

15. A device according to claim 14, wherein each channel is open and exposed to the rear surface of the target.

16. A device according to claim 14, including a flexible foil covering each channel for contact against the rear surface of the target.

17. A device according to claim 14, wherein said target support comprises a cooling plate, said cooling channels being separated from each other by webs defined in said cooling plate and positioned at the regions of high erosion, said webs mechanically supporting the rear surface of the target in the regions of high erosion.

18. A device according to claim 14, wherein the cooling channels are separated by webs, each web being positioned in a region of high erosion, said webs having a total width from about 10% to about 20% of a width of the target.

19. A device according to claim 18, wherein the webs are covered by a material which, if exposed to a breakthrough by a process producing the sputtering, changes conditions of the sputtering which are detectable.

20. A device according to claim 14, including covering the target support at locations spaced from the channels with material which changes conditions of sputtering for the target when breakthrough of the target occurs at one of the regions of high erosion, which change in conditions are detectable for detecting the occurrence of breakthrough.

21. A device according to claim 14 including webs between the channels, the device being used in a process which can admit contamination of a selected material, the webs being at least partly made by the selected material.

* * * * *